United States Patent [19]

Yasaitis

[11] Patent Number: 4,722,910
[45] Date of Patent: Feb. 2, 1988

[54] PARTIALLY SELF-ALIGNED METAL CONTACT PROCESS

[75] Inventor: John A. Yasaitis, Lexington, Mass.

[73] Assignee: Analog Devices, Inc., Norwood, Mass.

[21] Appl. No.: 867,048

[22] Filed: May 27, 1986

[51] Int. Cl.$^4$ .................. H01L 21/443; H01L 21/473
[52] U.S. Cl. ........................................ 437/44; 437/62; 437/203; 437/238; 437/978
[58] Field of Search .................. 357/47; 437/44, 62, 437/203, 238, 952, 978, 979

[56] References Cited

U.S. PATENT DOCUMENTS

| | | | |
|---|---|---|---|
| 4,404,733 | 9/1983 | Sasaki | 29/571 |
| 4,551,910 | 11/1985 | Patterson | 29/576 W |
| 4,577,391 | 3/1986 | Hsia et al. | 29/571 |

FOREIGN PATENT DOCUMENTS

| | | | |
|---|---|---|---|
| 0075875 | 4/1983 | European Pat. Off. | 29/576 W |
| 0164186 | 12/1985 | European Pat. Off. | 29/576 W |

OTHER PUBLICATIONS

J. Hui et al, "Electrical Properties of MOS Devices made with SILO Technology," *IEDM*, May 1982, pp. 220–223.

Y. Matsumoto et al, *IEEE Transactions on Electron Devices*, vol. ED-32, No. 2, Feb. 1985, pp. 429–433.

*Primary Examiner*—Olik Chaudhuri
*Attorney, Agent, or Firm*—Wolf, Greenfield & Sacks

[57] ABSTRACT

In a semiconductor device fabrication process, the SILO (Sealed Interface Local Oxidation) field oxide formation process is used to provide essentially vertical sidewalls between the field oxide surface and active regions. After field oxide formation and doping of active regions, the device is conformally coated with an oxide layer, which is patterned by a conventional photomasking process to define contact holes. Contact holes are then anisotropically etched through the oxide layer to the active regions. Conformal coating of the vertical sidewalls insures that an oxide sidewall spacer remains where the contact holes intersect the field oxide. Finally, a metal contact layer is deposited in the contact holes. The sidewall spacer automatically spaces the metal contact from the edges of the active region, thereby preventing leakage to the substrate.

14 Claims, 12 Drawing Figures

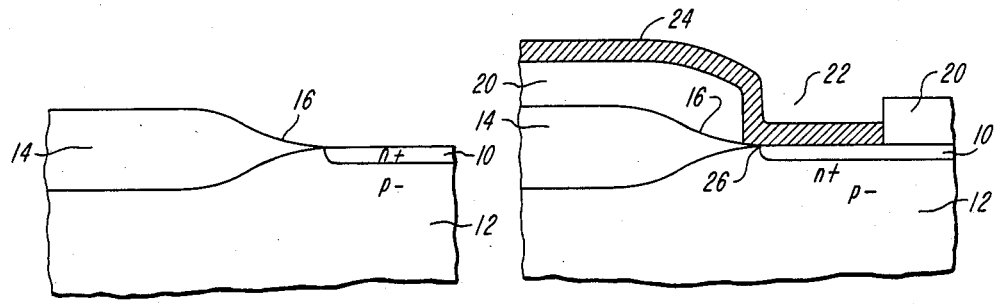
FIG. 1A
(PRIOR ART)
FIG. 1B
(PRIOR ART)
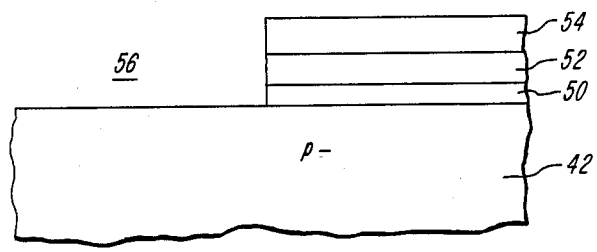
FIG. 2A
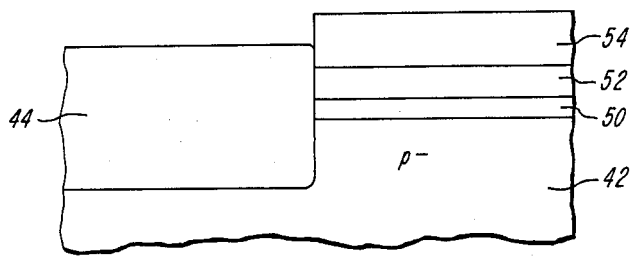
FIG. 2B
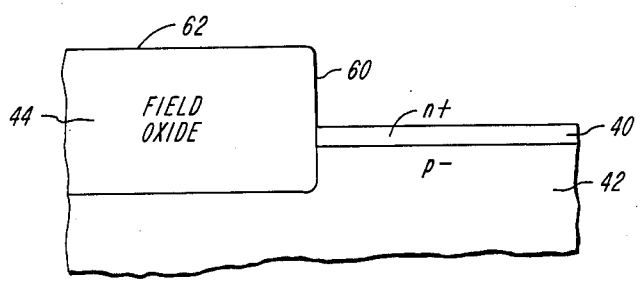
FIG. 2C

PARTIALLY SELF-ALIGNED METAL CONTACT PROCESS

FIELD OF THE INVENTION

This invention relates to the fabrication of semiconductor devices and, more particularly, to a process for device fabrication which uses the SILO (Sealed Interface Local Oxidation) process and oxide sidewall spacers to eliminate metal contact leakage, and to semiconductor devices produced by the process.

BACKGROUND OF THE INVENTION

In the fabrication of metal oxide semiconductor (MOS) integrated circuits, it is customary to utilize field oxides surrounding active elements, or regions, to establish electrical isolation between each active region and its neighbors. The field oxide is formed before doping of active transistor regions and must be patterned. A process of local oxidation known as LOCOS is commonly used for formation of the field oxide. According to the LOCOS process, a layer of silicon nitride is deposited by chemical vapor deposition on the surface of a wafer. A photoresist is then applied over the silicon nitride and patterned in a photomasking operation. The photoresist is developed and rinsed to remove exposed portions, and exposed areas of the silicon nitride are removed in a plasma etch step. Next, the photoresist is stripped from the device and a thermal oxidation step is used to form an oxide layer in the range of 5,000–10,000 angstroms thick. As the oxide grows, additional oxide is formed by diffusion of steam through the gradually growing oxide layer.

The diffusion of steam is an isotropic process and undercuts the silicon nitride masking layer. The undercut portion is tapered away from the field oxide layer toward the active region and is commonly known as a "bird's beak" because of its shape. The silicon nitride is later removed from the surface of the device, leaving the field oxide with tapered bird's beak edges at the intersections with the active regions. The field oxide is left with a shallow angle taper, typically less than 45°, as it intersects the active region. The bird's beak typically has a lateral dimension of 0.5 to 1.0 micrometer. When elements of the semiconductor device have dimensions of the same order, the bird's beak can present significant problems.

In subsequent processing steps, it is necessary to deposit an oxide layer over the wafer to form contact holes, or vias, by conventional photomasking techniques, and to then deposit a metal layer to make contact with the active region of the transistor. The tapered bird's beak region around the periphery of the device creates a problem in establishing metal contact to the active region. If the contact photoresist hole lies over the edge of this tapered oxide, then the end of the bird's beak is etched away during the contact etch. Also, the thin field oxide layer adjacent the edge of the active region provides a relatively low resistance path between the metal contact and the underlying substrate. As a result, leakage or short circuits can occur around the junction formed by the active region and the underlying substrate.

In the past, this problem has been alleviated by enlarging the active region in relation to the contact region so as to provide sufficient overlap that leakage paths are avoided. The drawback of this technique is that some of the substrate area is occupied by the larger active region which does not contribute to device performance, but merely obviates creation of the leakage paths. When tens of thousands of these devices are thus constructed on a chip, there is a substantial impact on device density. Therefore, it is desirable to overcome the leakage problem without adversely affecting device size and density.

A recently developed technique for forming the field oxide in MOS devices is known as sealed interface local oxidation (SILO). The SILO process is described by, for example, J. Hui et al in "*Electrical Properties of MOS Devices Made With SILO Technology,*" IEDM, May 1982, pp. 220–223. The process involves the formation of a nitride sealing film on the surface of the silicon, preventing lateral diffusion of the steam or other oxidizing species under the nitride masking layer. The SILO process for forming field oxide has provided nearly vertical steps at the interface between the field oxide layer and the active device.

It is a general object of the present invention to provide a novel method for semiconductor device fabrication.

It is a further object of the present invention to provide a method for semiconductor device fabrication wherein the bird's beak is eliminated as a leakage path between metal contacts and the underlying substrate.

It is a further object of the present invention to provide a method for semiconductor device fabrication wherein an oxide sidewall spacer is used to eliminate leakage paths between metal contacts and the underlying substrate.

It is a further object of the present invention to provide a method for semiconductor device fabrication wherein leakage from metal contacts is eliminated without enlarging the area to which contact is made.

It is a further object of the present invention to provide a semiconductor device wherein leakage paths between metal contacts and the underlying substrate are eliminated without enlarging the active region which is contacted.

SUMMARY OF THE INVENTION

According to the present invention, these and other objects and advantages are achieved in a method for semiconductor device fabrication. The method comprises the steps of defining an active region on the surface of a substrate and then growing a field oxide substantially surrounding the active region. The field oxide has a surface raised above the active region and has a substantially vertical sidewall connecting the field oxide surface and the active region. The method further comprises the steps of doping the active region with desired impurities, conformally coating the device surface with an oxide layer, defining a contact hole with a patterned masking layer, anisotropically etching the contact hole through the oxide layer to the active region and depositing a metal in the contact hole so as to contact the active region. The anisotropic etching step has a duration which leaves an oxide sidewall spacer where the contact hole intersects the field oxide so as to prevent current leakage between the metal contact and the substrate underlying the active region.

In a preferred embodiment, the substantially vertical sidewalls of the field oxide are formed in a sealed interface local oxidation process, which utilizes a nitride sealing film on the surface of the substrate to prevent lateral oxidation during field oxide growth.

The step of conformally coating the device with an oxide layer can be performed by low pressure chemical vapor deposition or plasma-enhanced chemical deposition. The oxide layer should have a thickness on the sidewall at least 60 percent of the thickness of the oxide layer on the horizontal surfaces.

According to a further aspect of the invention, there is provided a semiconductor device fabricated by the above-described process.

According to another aspect of the invention, after formation of the patterned masking layer as described above, the photoresist is heated sufficiently to cause plastic flow, which thereby slopes the walls of the resist. The anisotropic etching step also etches the resist at a somewhat slower rate than the oxide. As a result, the sidewalls of the oxide are slightly angled to insure metal coverage of the sidewalls during metal deposition.

BRIEF DESCRIPTION OF THE DRAWINGS

For a better understanding of the present invention together with other and further objects, advantages and capabilities thereof, reference may be had to the accompanying drawings in which:

FIGS. 1A and 1B are diagrammatic illustrations of contact hole formation in accordance with the prior art;

FIGS. 2A–2G are diagrammatic illustrations of the steps of the process of the present invention and a semiconductor device produced thereby.

DESCRIPTION OF THE PRIOR ART

Figure 2D:
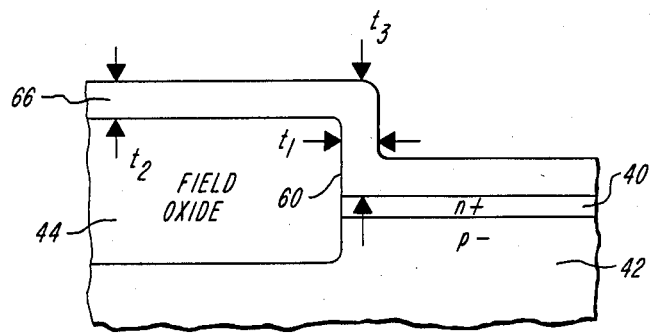

The prior art techniques for forming metal contacts and the problems associated therewith are illustrated with reference to FIGS. 1A and 1B. An active region 10 is defined in a substrate 12. A field oxide 14, for electrical isolation of the active region 10, is formed in a region of the substrate 12 surface surrounding the active region 10. The field oxide 14 is conventionally formed by local oxidation technology (LOCOS) which involves growing a thin pad oxide on the substrate surface for stress relief, then depositing a silicon nitride layer by chemical vapor deposition. The silicon nitride is patterned in a conventional photomasking operation, and is then etched in a plasma etch step. Next, the photoresist is stripped from the device. Thermal oxidation with steam is then used to form a relatively thick field oxide layer 14. Then, the silicon nitride is stripped from the device and the active region 10 is doped by conventional techniques, such as ion implantation or diffusion. The active region 10 can be an n+ type mesa electrode of an MOS transistor formed in a p− type substrate 12.

One drawback of the LOCOS process is that the steam used for oxidation of the silicon surface diffuses laterally under the silicon nitride masking layer, causing the field oxide 14 to have a tapered "bird's beak" edge 16. The tapered edge 16 makes a relatively shallow angle (typically less than 45°) with the surface of the active region 10.

In conventional subsequent processing steps, an oxide layer 20 is deposited over the entire surface of the device. Then, a photoresist layer (not shown) is applied over the oxide layer 20 and is patterned and developed in a conventional photomasking operation. Next, contact holes 22 are etched through the oxide layer 20 with the pattern defined by the photoresist. The photoresist is stripped from the device and the metal contact layer 24 is deposited. The metal layer 24 establishes electrical contact between the active region 10 and other circuit devices.

A problem occurs in the structure of the device shown in FIG. 1B at the edge 26 of the active region 10. Due to the tapered edge 16 of the field oxide 14, the thickness of the field oxide 14 over the substrate 12 next to the active region 10 is very small. As a result, if the contact hole 22 extends beyond the edge of the active region 10 over the substrate 12, the end of the bird's beak can be etched away during the contact etch and current leakage can occur between the metal contact 24 and the substrate 12, thereby electrically bypassing the active region 10. The characteristics of the diode formed by the n+region 10 and the p− substrate 12 are degraded by high leakage currents and, in some cases, a short circuit occurs. In the past, this problem has been overcome by enlarging the active region 10 so that it extends beyond the edge of the contact hole 22. Additional overlap margin is supplied in device layout such that with normal process biases and photolithography alignment tolerances, the contact will always be overlapped by the active region. However, this enlargement, when applied to an integrated circuit having tens of thousands of such devices, results in a substantial increase in circuit area and loss of chip area to nonproductive purposes.

DETAILED DESCRIPTION OF THE INVENTION

The present invention provides a method for semiconductor fabrication wherein the above-described leakage problem is resolved without the necessity for enlarging the active region. Briefly, the method of the present invention involves defining the active region on the surface of the semiconductor device. Next, a field oxide substantially surrounding the active region is grown, preferably by the SILO technique. The field oxide formed by the SILO technique has a surface raised above the active region and has substantially vertical sidewalls connecting the field oxide surface and the active region, rather than the highly tapered edge described above. Next, the active region is doped using conventional techniques and the field oxide surface, the active region and the sidewalls are conformally coated with an oxide layer, typically by low pressure chemical vapor deposition to insure coating of the sidewall. Contact holes are defined with a patterned masking layer and then are anisotropically etched through the oxide layer to the active region. The etching step has a duration which leaves an oxide sidewall spacer where the contact hole intersects the field oxide, which is self-aligned and which prevents leakage at the edge of the active region. Finally, metal is deposited in the contact hole over the active region.

The process of the present invention will now be described in detail with reference to FIGS. 2A–2G which illustrate the various steps of the process. It will be understood that many of the structures shown and described typically occur on a single integrated circuit device. The device can be an MOS integrated circuit.

A sealed interface local oxidation (SILO) process is used for formation of a field oxide 44 on a substrate 42 surrounding an active region 40 which is later doped with desired impurities. In the SILO process, a sandwich structure consisting of a thin, low pressure chemical vapor deposition nitride layer or a thermal nitride 50, a low pressure chemical vapor deposition oxide layer 52 and a low pressure chemical vapor deposition nitride layer 54 are applied over the surface of p-doped silicon substrate 42, as shown in FIG. 2A. The nitride layer 50 seals the surface of the underlying substrate against lateral oxidation. The device is then patterned in a conventional photomasking step. The layers 50, 52 and 54 are removed in the exposed pattern areas by appropriate etching steps to form an opening 56 for growth of the field oxide. The field oxide 44, as shown in FIG. 2B, can be formed by exposure to steam at 950° C. for approximately 190 minutes. The field oxide 44 is typically formed with a thickness in the range of 4,000 angstroms to 10,000 angstroms and preferably is about 6,500 angstroms thick. Subsequently, the remainder of the layers 50, 52 and 54 in the unexposed areas are removed (FIG. 2C). Further details of the SILO process are described in the Hui et al article, which is incorporated herein by reference. The active region 40 is subsequently n+ doped by ion implantation in accordance with a standard self-aligned silicon gate MOS process.

Due to the use of the SILO process including the nitride sealing layer 50, the field oxide 44 has a substantially vertical sidewall 60 extending between its upper surface 62 and the active region 40. The tapered edge characteristic of the LOCOS process is thus eliminated.

Next, an oxide layer 66 (FIG. 2D) is deposited on the upper surface of the wafer with a thickness in the range of 3,000 angstroms to 10,000 angstroms. Preferably, the thickness is about 6,000 angstroms. The oxide layer 66 is preferably deposited by low pressure chemical vapor deposition or plasma-enhanced chemical vapor deposition to insure isotropic deposition and conformal coating of the wafer surface. Conformal coating is important to insure that the sidewall 60 is covered by the oxide layer 66. As shown in FIG. 2D, the thickness $t_1$ of the oxide layer 66 on the sidewall 60 should be at least 60 percent of the thickness $t_2$ of the oxide layer 66 on the horizontal surfaces for reasons described hereinafter.

Figure 2E:
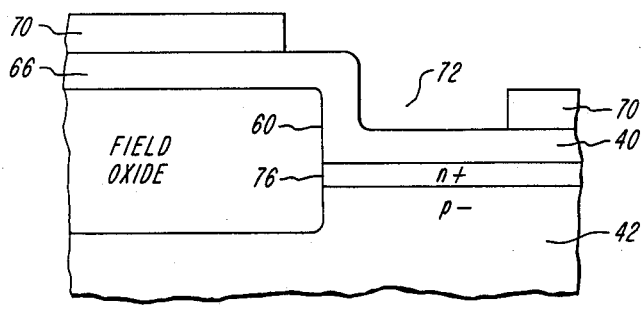

As shown in FIG. 2E, a photoresist layer 70 is applied over the surface of the oxide layer 66 and is exposed through a photomask in a conventional photomasking operation. The photoresist layer 70 is then developed and rinsed to remove exposed portions and thereby delineate contact holes 72.

Figure 2F:
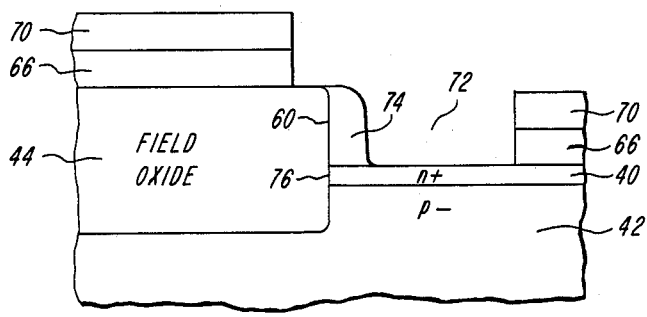

After completion of the patterning step, the device is anisotropically etched to produce uniform removal of the oxide layer 66 in a direction perpendicular to the device surface as shown in FIG. 2F. The anisotropic etching can be performed in an oxide plasma etching system. The oxide layer 66 is etched only in contact holes 72 and is protected where the photoresist layer 70 remains on the device surface. Due to the anisotropic nature of the etching process, a portion of the oxide layer 66, referred to as an oxide sidewall spacer 74, remains after completion of the etching step. With reference to FIG. 2D, it can be seen that the vertical thickness $t_3$ of the oxide layer 66 adjacent the sidewall 60 is considerably greater than the thickness $t_2$ of the oxide layer 66 in the horizontal regions. Thus, anisotropic etching sufficient to etch a layer of thickness $t_2$ removes only a portion of the oxide layer 66 adjacent the sidewall 60 and leaves oxide sidewall spacer 74. The sidewall spacer 74 is highly advantageous in providing dielectric protection against current leakage around edge 76 of active region 40. Spacer 74 is self-aligning since it is formed automatically on the sidewall 60 where the contact hole 72 intersects the field oxide 44.

Figure 2G:
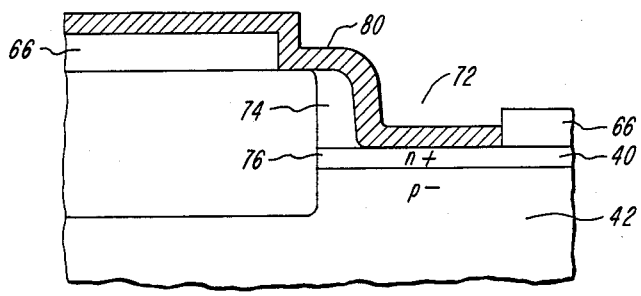

A metal contact 80 is then deposited in the contact hole 72 for establishing electrical contact to the active region 40. As seen in FIG. 2G, the sidewall spacer 74 spaces the metal contact 80 from the edge 76 of the active area 40 so as to prevent current leakage. As a result, no enlargement of the active region 40 is necessary to prevent the current leakage described hereinabove in connection with the prior art.

Figure 3A:
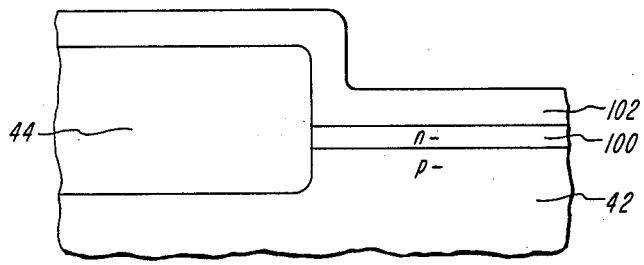
FIG. 3A–3C are diagrammatic illustrations of metal contact formation in accordance with another preferred embodiment of the present invention.
Figure 3B:
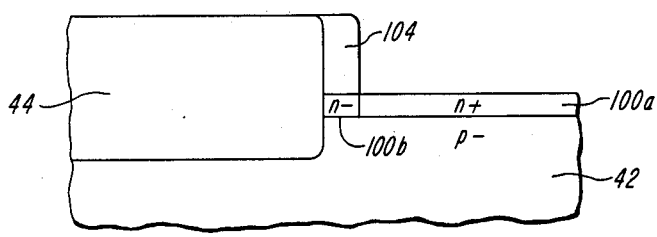
Figure 3C:
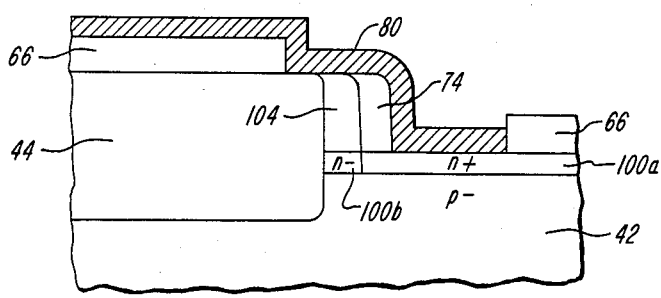

The method in accordance with the present invention can be employed in conjunction with the formation of so-called lightly doped drain structures as illustrated in FIGS. 3A–3C. First, a field oxide 44 is formed around active regions as shown in FIGS. 2A and 2B and described hereinabove. Next, a lightly doped n− region 100 is formed in the active region by ion implantation or diffusion as shown in FIG. 3A. Then, the device is conformally coated with an oxide layer 102 by low pressure chemical vapor deposition or plasma-enhanced chemical vapor deposition. Referring now to FIG. 3B, the oxide layer 102 is etched away in an anisotropic etching step, leaving an oxide sidewall spacer 104 at the edge of the active region for the reasons described hereinabove in connection with sidewall spacer 74. Next, the active region is doped by ion implantation or diffusion to form an n+ portion 100a of the active region not protected by the sidewall spacer 104. Underneath the sidewall spacer 104, the active region remains n− doped as shown at 100b. Thereafter, the process is exactly as shown in FIGS. 2B–2G and described hereinabove. In the final device shown in FIG. 3C, the sidewall spacer 74 spaces the metal contact 80 from the edge of the n+ region 100a and prevents current leakage between the metal contact 80 and the substrate 42. For further information regarding the lightly doped drain process, see Y. Matsumoto et al, IEEE Transactions on Electron Devices, Vol. ED-32, No. 2, Feb. 1985, pp. 429–433, which is incorporated herein by reference.

In another embodiment of the present invention, the process described above further includes a step of heating the device after patterning of the photoresist as shown in FIG. 2E almost to the melting point of the photoresist layer 70. The heating causes a slight plastic flow of the photoresist layer, and a sloping of the resist layer at pattern edges. Next, the etching step is done in an anisotropic manner, but the etch process is adjusted to etch the photoresist at approximately one-half the rate at which the oxide is etched. The heating and adjusted etch process produce a contact hole 72 with slightly sloping walls. The sloping walls facilitate the deposition of a uniform metal layer, in contrast to vertical sidewalls wherein step coverage by metal can be difficult to achieve.

While there has been shown and described what is at present considered the preferred embodiments of the present invention, it will be obvious to those skilled in the art that various changes and modifications may be made therein without departing from the scope of the invention as defined by the appended claims.

What is claimed is:

1. A method for fabricating semiconductor devices comprising the steps of:

defining an active region on the surface of a semiconductor substrate;

growing a field oxide substantially surrounding said active region, said field oxide having a surface raised above said active region and having a substantially vertical sidewall connecting said field oxide surface and said active region;
doping said active region with desired impurities;
conformally coating said field oxide surface, said active region and said sidewall with an oxide layer;
defining a contact hole with a patterned masking layer;
anisotropically etching the contact hole through said oxide layer to said active region, said etching step having a duration which leaves an oxide sidewall spacer where the contact hole intersects said field oxide; and
depositing a metal in said contact hole on the surface of said active region.

2. A method for semiconductor device fabrication as defined in claim 1 wherein said step of conformally coating the device with an oxide layer includes coating said sidewall with an oxide layer having a thickness of at least 60 percent of the thickness of the oxide layer on said active region and said field oxide surface.

3. A method for semiconductor device fabrication as defined in claim 1 wherein said step of growing a field oxide is performed by a sealed interface local oxidation process wherein a nitride sealing layer is applied to the surface of said device to prevent lateral oxidation and to provide said substantially vertical sidewall.

4. A method for semiconductor device fabrication as defined in claim 2 wherein said step of conformally coating said device with an oxide layer includes low pressure chemical vapor deposition of said oxide layer.

5. A method for semiconductor device fabrication as defined in claim 2 wherein said step of conformally coating said device with an oxide layer includes plasma-enhanced chemical vapor deposition of said oxide layer.

6. A method for semiconductor device fabrication as defined in claim 1 wherein said active region comprises a mesa electrode of an MOS transistor.

7. A method for semiconductor device fabrication as defined in claim 1 wherein the step of defining a contact hole includes the steps of
applying a photoresist layer over the surface of said oxide layer,
exposing selected portions of said photoresist layer, and
developing and removing the selected portions of said photoresist layer so as to provide said patterned masking layer.

8. A method for semiconductor device fabrication as defined in claim 7 further including the step of heating the photoresist layer after patterning, sufficient to cause plastic flow thereof, and performing said step of anisotropically etching a contact hole with controlled photoresist etching to result in slightly sloping sidewalls.

9. A method for semiconductor device fabrication as defined in claim 3 wherein said field oxide is grown to a thickness in the range between 4,000 angstroms and 10,000 angstroms.

10. A method for semiconductor. device fabrication as defined in claim 9 wherein said conformally coated oxide layer is deposited to a thickness in the range between 3,000 angstroms and 10,000 angstroms.

11. A method for semiconductor device fabrication comprising the steps of:
defining an active region on the surface of a substrate of a semiconductor device;
growing a field oxide adjacent said active region, said field oxide having a surface raised above said active region and having a substantially vertical sidewall connecting said field oxide surface and said active region;
doping said active region with impurities;
conformally coating the surface of said device with an oxide layer such that said sidewall is coated with a substantial thickness of said oxide layer;
applying a photoresist layer over said oxide layer;
exposing, developing and removing selected portions of said photoresist layer so as to provide a patterned masking layer which defines a contact hole;
anisotropically etching the contact hole through said oxide layer to said active region in said selected portions of said patterned masking layer, said etching step having a duration which leaves an oxide sidewall spacer where the contact hole intersects said field oxide; and
depositing a metal on said device so as to contact said active region through said contact hole.

12. A method for semiconductor device fabrication as defined in claim 11 wherein said step of conformally coating the device with an oxide layer includes coating said sidewall with an oxide layer having a thickness of at least 60 percent of the thickness of the oxide of said active region and said field oxide surface.

13. A method for semiconductor device fabrication as defined in claim 11 wherein said step of growing a field oxide is performed by a sealed interface local oxidation process wherein a nitride sealing layer is applied to the surface of said device to prevent lateral oxidation and provide said substantially vertical sidewall.

14. A method for semiconductor device fabrication as defined in claim 11 further including, after the step of growing a field oxide, the additional steps of:
lightly doping said active region;
conformally coating said device with oxide; and
anisotropically etching said oxide except for portion on the sidewall of said field oxide.

* * * * *